United States Patent
Takahashi et al.

(10) Patent No.: US 8,455,283 B2
(45) Date of Patent: Jun. 4, 2013

(54) ORGANIC ELECTRONIC ELEMENT AND ITS MANUFACTURING METHOD

(75) Inventors: Nobuaki Takahashi, Tama (JP); Hiroaki Yamagishi, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 86 days.

(21) Appl. No.: 13/254,886

(22) PCT Filed: Mar. 3, 2010

(86) PCT No.: PCT/JP2010/053411
§ 371 (c)(1),
(2), (4) Date: Sep. 6, 2011

(87) PCT Pub. No.: WO2010/103967
PCT Pub. Date: Sep. 16, 2010

(65) Prior Publication Data
US 2011/0315972 A1     Dec. 29, 2011

(30) Foreign Application Priority Data
Mar. 13, 2009 (JP) .................. 2009-061042

(51) Int. Cl.
*H01L 21/00* (2006.01)
(52) U.S. Cl.
USPC .................. 438/46; 438/29; 438/57; 257/40; 257/E51.001; 257/E51.018
(58) Field of Classification Search
USPC .................. 438/46, 29, 57; 257/40, E51.001, 257/E51.018
See application file for complete search history.

(56) References Cited

FOREIGN PATENT DOCUMENTS

| | | |
|---|---|---|
| JP | 2001-57287 A | 2/2001 |
| JP | 2003-77669 A | 3/2003 |
| JP | 2003-264073 A | 9/2003 |
| JP | 2004-111380 A | 4/2004 |
| JP | 2004-134279 A | 4/2004 |
| JP | 2005-108653 A | 4/2005 |
| JP | 2005-205683 A | 8/2005 |
| JP | 2006-236791 A | 9/2006 |
| JP | 2007-266161 A | 10/2007 |
| JP | 2007-284472 A | 11/2007 |
| JP | 2007-287557 A | 11/2007 |
| WO | 2005/096675 A1 | 10/2005 |

OTHER PUBLICATIONS

International Search Report for International Patent Application No. PCT/JP2010/053411 mailed Mar. 30, 2010 with English translation.
Written Opinion of the International Searching Authority for International Application No. PCT/JP2010/053411 with English translation.

*Primary Examiner* — Junghwa M Im
(74) *Attorney, Agent, or Firm* — Cantor Colburn LLP

(57) ABSTRACT

The present invention provides an organic electronic element manufacturing method which provides a low manufacturing cost and excellent performance stability, and specifically an organic electronic element manufacturing method which provides a low manufacturing cost, and minimizes emission unevenness, lowering of emission efficiency and shortening of lifetime due to deterioration of gas barrier property of sealing. The organic electronic element manufacturing method is featured in that it comprises the steps of forming an organic electronic structure composed of a first electrode, at least one organic layer and a second electrode on a flexible substrate, and applying a flexible sealing substrate to the organic electronic structure, followed by heating treatment, wherein a heating temperature, at which the heating treatment is carried out, is less than Tg (glass transition temperature) of the substrate and not less than Tg of the sealing substrate.

5 Claims, 3 Drawing Sheets

TRANSPORT DIRECTION

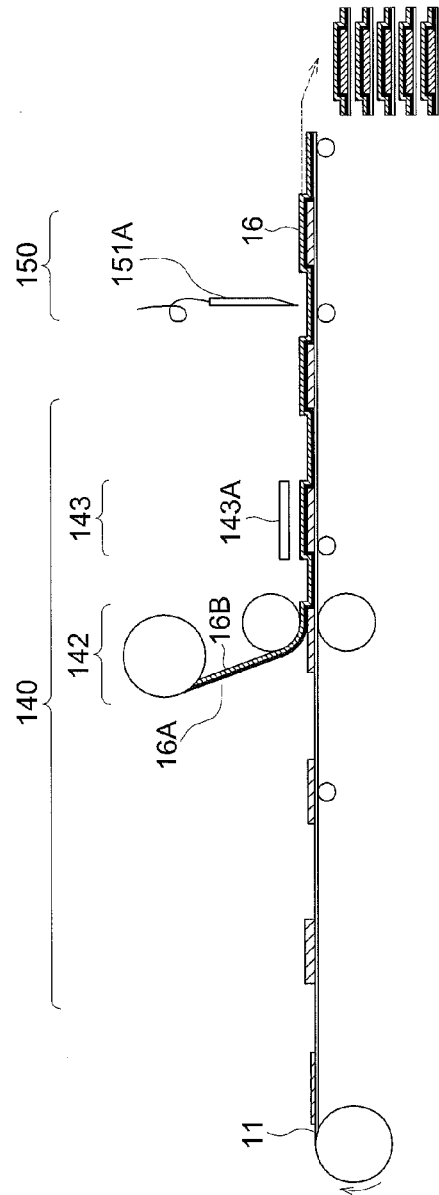
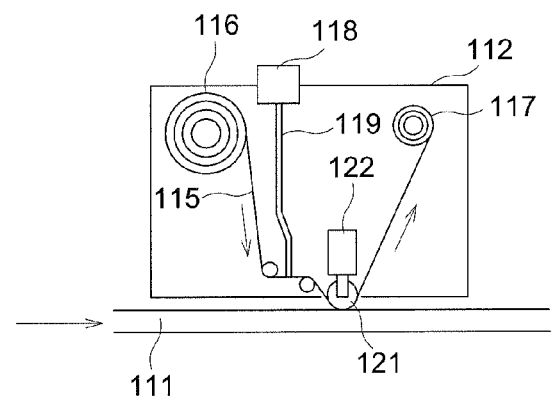

ORGANIC ELECTRONIC ELEMENT AND ITS MANUFACTURING METHOD

This is a U.S. national stage application of International Application No. PCT/JP2010/053411, filed on 3 Mar. 2010. Priority under 35 U.S.C. 119(a) and 35 U.S.C. 365(b) is claimed from Japanese Application No. 2009-061042, filed 13 Mar. 2009, the disclosure of which is also incorporated herein by reference.

TECHNICAL FIELD

The invention relates to an organic electronic element manufacturing method and an organic electronic element manufactured by the organic electronic element manufacturing method. Further, the invention relates to a manufacturing method of an organic electronic element utilized as a surface light source, a display, a solar battery and the like, particularly to a manufacturing method of an organic electronic element provided on a flexible substrate such as a plastic film, and to an organic electronic element manufactured by the manufacturing method.

TECHNICAL BACKGROUND

In order to form an organic layer (referred to also as an organic compound layer, for example, a hole injection layer, a hole transport layer, a light emission layer, a hole blocking layer, an electron transport layer, a hole transport layer, etc.) of an organic electronic element, various methods such as a vapor deposition method, a sputtering method, a CVD, a PVD, a coating method utilizing a solvent have been hitherto employed; however, among these, it is known that a wet film formation method such as a coating method is advantageous in view of such as simplification of a manufacturing process, reduction of a manufacturing cost, improvement of a processing property and an application to a flexible element having a large area such as a backlight or an illumination light source. For example, a method to form an organic compound layer on a glass film of the sheet form by a spin coat method is described in Japanese Patent O.P.I. Publication No. 2002-170676. A method to successively form organic compound layers on a glass plate of the sheet form by an ink jet method is described in Japanese Patent O.P.I. Publication No. 2003-142260. Since a film of the sheet form is utilized as a film in any of these methods, an apparatus for manufacturing a full color display element with a large area is large, resulting in high cost. Therefore, study has been made are made on a roll-to-roll method as an economical manufacturing method of an organic electroluminescence element (hereinafter also referred to as organic EL element), which is considered to be useful for a solid emission type full color display element with a large area or writing light source array, as described in Patent Document 1.

As a manufacturing method of an organic EL display comprising a plastic film as a transparent base plate and provided thereon, a cathode, one or two or more light emission layers composed of an organic compound and an anode, a method is known in which the organic light emission layer or layers are formed according to a coating method employing a coating material in which a low molecular weight emission dye is dispersed or dissolved in a polymeric material such as polystyrene, polymethyl methacrylate and polyvinyl carbazole or a coating material employing a polymeric material such as polyphenylenevinylene or polyalkylfluorene together with an appropriate solvent (refer to, for example, Patent Document 1).

At present, as an organic EL material, there are mentioned a low molecular weight material and a high molecular weight material. The low molecular weight material can be purified by sublimation and is likely to purify. Therefore, it can be employed as a highly purified organic EL material and excels in efficiency or lifetime. On the other hand, the high molecular weight material is difficult to purify, and has disadvantages in that performance such as efficiency or lifetime is deteriorated. Therefore, in recent years, study has been made on a wet film formation method employing the low molecular weight material.

It is known that when a sealed element is subjected to heating treatment, heating treatment is carried out at a temperature of less than Tg of the substrate, since heating treatment at a high temperature of not less than Tg of the substrate produces emission unevenness or deformation in the wave form of the substrate, (Refer to Patent Document 2). However, even heating treatment at a temperature of less than Tg of the substrate produces deterioration of lifetime or reduction of emission area. As a result of study, it has proved that a gas barrier property of seal is deteriorated which is considered to result from separation or breakage of a sealing material due to inner stress of the substrate and the sealing substrate on heating treatment at a low temperature.

PRIOR ART LITERATURES

Patent Documents

Patent Document 1: Japanese Patent O.P.I. Publication No. 2003-77669
Patent Document 2: WO 05/096675

DISCLOSURE OF THE INVENTION

Problems to be Solved by the Invention

In view of the above, the invention has been made. An object of the invention is to provide a manufacturing method of an organic electronic element which is low in manufacturing cost and excellent in stability of performance, and particularly to provide a method of manufacturing an organic electronic element which is low in manufacturing cost, and minimizes reduction of emission area and shortening of lifetime due to deterioration of a gas barrier property of seal, as well as occurrence of emission unevenness.

Means for Solving the Above Problems

The above object of the invention has been attained by the following constitutions.

1. An organic electronic element manufacturing method featured in that it comprises the steps of forming an organic electronic structure composed of a first electrode, at least one organic layer, and a second electrode on a flexible substrate, and applying a flexible sealing substrate to the resulting organic electronic structure, followed by heating treatment, wherein a heating temperature, at which the heating treatment is carried out, is less than Tg (a glass transition temperature) of the substrate and not less than Tg (a glass transition temperature) of the sealing substrate.

2. The organic electronic element manufacturing method of item 1 above featured in that a barrier film is formed on the sealing substrate.

3. The organic electronic element manufacturing method of item 1 or 2 above featured in that the substrate is a long length substrate.

4. The organic electronic element manufacturing method of any one of items 1 through 3 above featured in that the organic electronic element is an organic electroluminescent element.

5. An organic electronic element featured in that it is manufactured according to the organic electronic element manufacturing method of any one of items 1 through 4 above.

Effects of the Invention

The present invention can provide a method of manufacturing an organic electronic element which provides a low manufacturing cost and excellent performance stability. Particularly, the present invention can provide a method of manufacturing an organic electronic element which provides a low manufacturing cost, and minimizes reduction of emission area and shortening of lifetime due to deterioration of a gas barrier property of seal, as well as emission unevenness.

BRIEF EXPLANATION OF THE DRAWINGS

FIG. 4 is a schematic view showing one embodiment of an adhesion step and a cutting step of a sealing substrate in the invention.

FIG. 5 is a schematic view of an apparatus employed for removal of an organic layer.

PREFERRED EMBODIMENT OF THE INVENTION

Figure 1A:
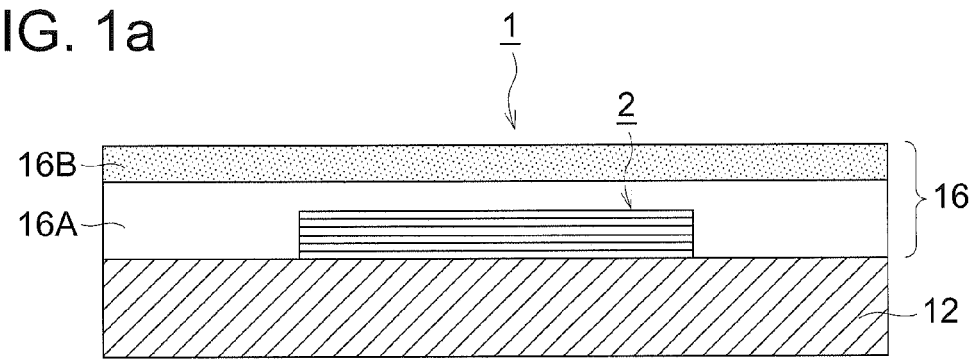
FIG. 1a is a schematic view showing a fundamental constitution of the whole of an organic EL element.

An organic EL element, which is one of organic electronic elements, is extremely sensitive to substances represented by moisture, oxygen and the like which interfere with an electrochemical process from when an exciton is produced in a light emission layer till when emission occurs. When these substances diffuse into the organic EL element from the outside, emission efficiency or lifetime extremely deteriorates, and practical performance for illumination or displaying cannot be obtained. Further, substances such as moisture, oxygen and the like vary electrical or chemical properties of the surface or the inside of electrodes, or may interfere with migration of electrons or holes, which greatly lowers practical performances. Accordingly, techniques for securing the performance of an organic EL element have been studied, for example, a technique in which an organic EL element is enclosed in a glass or a metal with a sealed drying agent or a technique in which a sealing having a bather property to a gas component such as moisture or oxygen is employed.

The present inventors have made a detailed study on heat treatment (heat adhesion) carried out when the organic EL element is sealed with a sealing substrate employing a heat curable adhesive.

As a result, it has been found that when an organic EL structure, after formed on a flexible substrate, is heated at a temperature of not less than Tg of the substrate, problems such as emission unevenness, shortening of lifetime or lowering of emission efficiency occur in the organic EL element, while when an organic EL structure, after formed on a flexible substrate, is heated at a temperature of less than Tg of the substrate, these problems do not occur.

The reason is considered to be as follows. When the organic EL structure is heated at a temperature of not less than Tg of the substrate, the substrate, to which tension is applied, softens and deforms, and as a result, the inside stress being increased, the organic EL structure in direct contact with the substrate is subjected to damage, which causes emission unevenness, shortening of lifetime or lowering of emission efficiency in the organic EL element. On the other hand, when the organic EL structure is heated at a temperature of less than Tg of the substrate, the substrate is difficult to soften and deform, and as a result, the organic EL structure is difficult to be subjected to damage, which solves problems such as emission unevenness, shortening of lifetime and lowering of emission efficiency in the organic EL element.

Further, it has been found that when an organic EL structure, after formed on a flexible substrate, is heated at a temperature of less than Tg of a sealing substrate, problems such as shortening of lifetime or lowering of emission efficiency occur in the organic EL element, while when an organic EL structure, after formed on a flexible substrate, is heated at a temperature of not less than Tg of the sealing substrate, these problems do not occur.

The reason is considered to be as follows. When the organic EL structure is heated at a temperature of less than Tg of the sealing substrate, the organic EL structure, which is to be adhered to the sealing substrate, is subjected to damage by pressure applied on the adhering on account of the rigidity of the sealing substrate and the sealing substrate does not conform to the form of the organic EL structure, whereby the adhesion properties are lowered, resulting in lowering of gas barrier property. As a result, shortening of lifetime or lowering of emission efficiency occurs in the organic EL element. On the other hand, when the organic EL structure is heated at a temperature of not less than Tg of the sealing substrate, the sealing substrate softens and deform, and comforts to the form of the organic EL structure which is to be adhered to the sealing substrate, and as a result, the organic EL structure is difficult to be subjected to damage, which solves problems such as shortening of lifetime and lowering of emission efficiency in the organic EL element.

Particularly, the organic electronic element manufacturing method of the invention is suitably employed as an organic EL element manufacturing method.

An organic EL element manufactured according to the organic electronic element manufacturing method of the invention improves gas barrier property, and excels in performance such as half lifetime or emission efficiency.

Next, the present invention, its constituent and preferred embodiment for conducting the invention will be explained in detail.

<<Outline of Organic Electronic Element Manufacturing Method>>

The organic electronic element manufacturing method of the invention is featured in that it comprises the steps of forming an organic electronic structure composed of a first electrode, at least one organic layer, and a second electrode on a flexible substrate, and applying a flexible sealing substrate to the resulting organic electronic structure, followed by heating treatment, wherein a heating temperature, at which the heating treatment is carried out, is less than Tg (a glass transition temperature) of the substrate and not less than Tg (a glass transition temperature) of the sealing substrate.

Next, in the steps of an organic electronic element manufacturing method, the manufacturing steps of an organic EL element, which is one of the organic electronic elements, will be explained, referring to figures.

<Washing Step>

The washing step is a step of washing a substrate by a combination of wet washing, in which a substrate in the roll form is unwound and immersed in an ultrasonic washing tank for washing, and dry washing such as plasma washing.

<Organic Electronic Element Formation Step>

The organic electronic element formation step is a step forming an organic EL structure on a substrate employing well known techniques such as a vacuum deposition method, a spin coating method, an extrusion coating method, an ink jet method and a printing method.

Figure 1B:
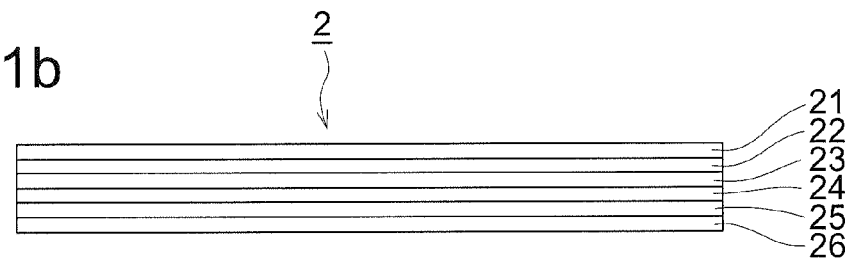
FIG. 1b is a schematic view showing the constitution of the organic EL structure part of an organic EL element.

FIG. 1 shows a fundamental constitution of an organic EL element, one of organic electronic elements, in which electrodes are not illustrated. FIG. 1a is a schematic view showing a fundamental constitution of the whole of an organic EL element. In the organic EL element 1, an organic EL structure 2 on a substrate 12 is sealed with a sealing substrate layer 16 composed of an adhesive 16A and a sealing substrate (sealing film) 16B. FIG. 1b is a schematic view showing the constitution of the organic EL structure 2 of the organic EL element. The organic EL structure 2 is composed of a cathode 21, an electron injection layer 22, a light emission layer 23, a hole transport layer 24, a hole injection layer 25 and an anode 26. Each constituent layer constituting the organic EL element 1 will be explained in detail later.

<Substrate Supply Step>

The substrate supply step is a step of unwinding and supplying a substrate 11 in the roll form with the organic EL structure 2 provided thereon.

<Sealing Step>

The sealing step is a step in which a long length sealing substrate 16B is adhered to the substrate 11 to cover the organic EL structure 2 through a heat curable adhesive 16A to form a sealing substrate layer 16. The sealing substrate 16B and the heat curable adhesive 16A will be detailed later.

In the invention, in this step, the flexible sealing substrate is applied only on the center portion of the organic EL structure except for an electrode extracting portion, and then the resulting product is subjected to heating treatment at a temperature of less than Tg of the substrate and at a temperature of not less than Tg of the sealing substrate.

<Cutting Step>

The cutting step is a step in which after the heat curable adhesive 16A, through which the sealing substrate 16B is adhered to the substrate 11, is cured, the substrate 11 having the organic EL structure 2 with the sealing substrate layer 16 applied thereon is cut to form an organic EL element.

Figure 2A:
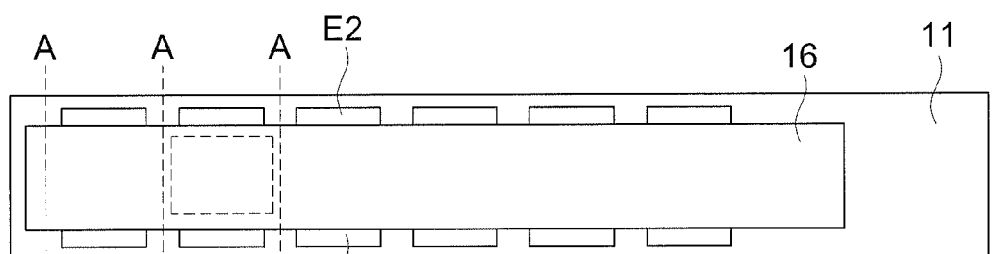
FIG. 2 is a schematic view showing a sealing step in which a sealing substrate is adhered onto a substrate with a heat curable adhesive and a cutting step in which a cutting position is shown.
Figure 2B:
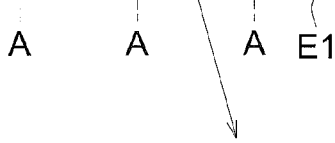
Figure 2C:
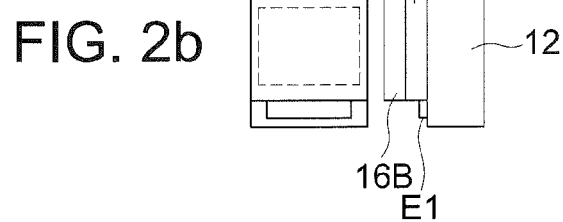

FIG. 2a is a schematic view of a sealing step in which a sealing substrate is adhered to a substrate with an organic EL structure provided thereon through a heat curable adhesive and a cutting step in which after the heat curable adhesive is cured, the resulting product is cut. FIG. 2b is one organic EL element obtained by the cutting. FIG. 2c is a side view of FIG. 2b.

In the invention the above means provides an organic EL structure which is difficult to be damaged and which eliminates problems such as emission unevenness, lifetime deterioration or emission efficiency deterioration.

[Basic Constitution of Organic EL Element]

Preferred embodiments of the basic constitution of the organic EL structure in the organic EL element will be shown below.

(i): Substrate/Anode/Light emission layer/Electron transport layer/Cathode (ii): Substrate/Anode/Hole transport layer/Light emission layer/Electron transport layer/Cathode (iii): Substrate/Anode/Hole transport layer/Light emission layer/Hole blocking layer/Electron transport layer/Cathode (iv): Substrate/Anode/Hole transport layer/Light emission layer/Hole blocking layer/Electron transport layer/Cathode buffering layer/Cathode (v): Substrate/Anode/Anode buffering layer/Hole transport layer/Light emission layer/Hole blocking layer/Electron transport layer/Cathode buffering layer/Cathode Herein, a light emission layer preferably contains at least two kinds of light emission materials having a different emission color, and may be a single layer or a light emission layer unit composed of a plurality of light emission layers. Further, a hole transport layer comprises a hole injection layer and an electron blocking layer.

(Substrate>

In the invention, it is necessary to employ, as the substrate in the invention, a flexible substrate capable of providing flexibility to the organic EL element in the invention, for example, a resin film. However, metal, glass or quartz can be partially employed as the substrate according to an intended object. As the substrate, a long length one is preferred in view of productivity.

Examples of materials for the resin film include polyesters such as polyethylene terephthalate (PET) and polyethylene naphthalate (PEN), polyethylene, polypropylene, cellophane, cellulose esters and their derivatives such as cellulose diacetate, cellulose triacetate, cellulose acetate butylate, cellulose acetate propionate (CAP), cellulose acetate phthalate, and cellulose nitrate, polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or polyarylates, and cyclo-olefin resins such as ARTON (commercial name, manufactured by JSR Corp.) or APEL (commercial name, manufactured by Mitsui Chemicals Inc.).

The thickness of the substrate is not generally defined, however, the thickness is preferably from 3 to 400 μm, more preferably from 50 to 300 μm, and still more preferably from 100 to 200 μm.

Kinds and Tg of the resin film preferably employed in the invention are as follows.

| | |
|---|---|
| Polyethylene | −20° C. |
| Polypropylene | −20° C. |
| Polyvinyl chloride | 80° C. |
| Polystyrene | 100° C. |
| Polycarbonate | 150° C. |
| Cast PET | 80° C. |
| Cast PEN | 120° C. |
| Oriented PET | 110° C. |
| Oriented PEN | 155° C. |

Besides the above, nylon (Ny), nylon (KNy) coated with vinylidene chloride (PVDC), polypropylene (KOP) coated with PVDC, cellophane (KR) coated with PVDC, or ethylene-vinyl alcohol copolymer (Eval) can be employed as the resin for the resin film. A multi-layered resin film can be employed which is obtained by co-extruding these resin films together with a different film or adhering these resin films onto a different film varying an oriented angle, as necessary. Further, in order to obtain a required property of a material for a package, a density and a molecular weight distribution of the film are combined. In the invention, Tg of the sealing substrate composed of a multi-layered resin film is defined as Tg of a resin having the lowest Tg among the resins constituting the multi-layered resin film.

A barrier film may be formed on the surface of the resin film, and the barrier film is preferably one with a barrier ability having a vapor permeability (at 40° C. and at 90% RH) of not more than 0.01 g/(m$^2$·day·atm) measured by a method stipulated by JIS K 7129-1992, and more preferably one with a high barrier ability having an oxygen permeability (at 20° C. and at (100% RH) of not more than $10^{-3}$ g/(m$^2$·day) and a vapor permeability of not more than $10^{-3}$ g/(m$^2$·day), measured by a method stipulated by JIS K 7126-1992. It is still more preferred that both the vapor permeability and the oxygen permeability are not more than $10^{-5}$ g/(m$^2$·day).

Any materials capable of preventing penetration of substance such as moisture and oxygen causing degradation of the element can be employed for forming the barrier film, for example, silicon oxide, silicon dioxide and silicon nitride can be employed. It is more preferred that the barrier film has a multi-laminated layer structure composed of a layer of the inorganic material and a layer of an organic material for improving fragility of the film. It is preferred that the both layers are alternatively laminated several times though there is no limitation as to the lamination order of the inorganic layer and the organic layer.

The method for forming the barrier film is not specifically limited and, for example, a vacuum deposition method, a spattering method, a reaction spattering method, a molecule beam epitaxy method, a cluster-ion beam method, an ion plating method, a plasma polymerization method, an atmospheric pressure plasma polymerization method, a plasma CVD method, a laser CVD method, a heat CVD method and a coating method are applicable, and the atmospheric pressure plasma polymerization method as described in Japanese Patent O.P.I. Publication No. 2004-68143 is particularly preferred.

(Electrode)

The organic EL element of the invention has at least a first electrode and a second electrode. Generally, one of the electrode forms an anode, and the other a cathode. Next, a preferred anode and cathode will be explained.

<Anode>

For the anode of the organic EL element, a metal, an alloy, or an electroconductive compound each having a high working function (not less than 4 eV), and mixture thereof are preferably used as the electrode material. Typical examples of such an electrode material include a metal such as Au, and a transparent electroconductive material such as CuI, indium tin oxide (ITO), SnO$_2$ or ZnO. A material such as IDIXO (In$_2$O$_3$—ZnO) capable of forming an amorphous and transparent conductive layer may be used. The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When a coatable material such as an organic conductive compound is used, a wet coating method such as a printing method or a coating method can be used. The sheet resistance as the anode is preferably not more than several hundreds Ω/□. The thickness is ordinarily within the range of from 10 to 1000 nm, and preferably from 10 to 200 nm, although it may vary due to kinds of materials used.

<Cathode>

For the cathode, a metal (also referred to as an electron injection metal), an alloy, and an electroconductive compound each having a low working function (not more than 4 eV), and a mixture thereof is employed as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide (Al$_2$O$_3$) mixture, indium, a lithium/aluminum mixture, and a rare-earth metal.

The cathode can be prepared forming a thin layer of such an electrode material by a method such as a deposition or spattering method. The sheet resistance as the cathode is preferably not more than several hundreds Ω/□, and the thickness is ordinarily from 10 nm to 5 μm, and preferably from 50 to 200 nm.

Either the anode or the cathode of the organic EL element is structured to be transparent in order to pass the emission luminance through it.

<Light Emission Layer>

The light emission layer in the invention is a layer where electrons and holes, which are injected from electrodes, an electron transport layer or a hole transport layer, are recombined to emit light. The portions where light emits may be in the light emission layer or at the interface between the light emission layer and the layer adjacent thereto.

The light emission layer in the invention is not specifically limited to the constitution, as long as a light emission material contained in the light emission layer satisfies the condition described above.

The sum of the thickness of the light emission layer is in the range of preferably from 1 to 200 nm, and in the range of more preferably from 5 to 100 nm, in view of obtaining low driving voltage.

The light emission layer in the invention can be formed according to a known film formation method such as a vacuum deposition method, a spin coating method, an extrusion coating method, an ink jet method or a printing method, employing a light emission material or a host compound described later.

In the invention, a mixture of plural light emission materials may be contained in each light emission layer, and a fluorescence emission material and a phosphorescence emission material may be contained in the same light emission layer. Further, the light emission layer may be composed of plural layers.

In the invention, the light emission layer contains a host compound, and a light emission material (referred to also as light emission dopant compound), in which light is preferably emitted from the light emission material.

The host compound contained in the light emission layer of the organic EL element in the invention is preferably a compound which has a phosphorescence quantum yield at room temperature (25° C.) of less than 0.1. The phosphorescence quantum yield of the host compound is more preferably less than 0.01. The content of the host compound in the light emission layer is preferably not less than 50% by volume.

As the host compound, known host compounds may be used singly or as an admixture of two or more kinds thereof. Use of plural host compounds can adjust charge transfer, and obtain an organic EL element with high efficiency. Further, use of plural light emission materials described later can mix lights with a different color, and can emit light with any color.

The light emission host used in the invention may be a conventional low molecular weight compound, a polymeric compound having a repeating unit or one or more kinds of a low molecular weight compound (vapor-polymerizable light emission host) with a polymerizable group such as a vinyl group or an epoxy group.

A known host compound, which may be used in combination, is preferably a compound which has a hole transporting capability and an electron transporting capability, prevents shift of a wavelength of emission light to longer wavelength, and has high Tg (glass transition temperature). Herein, the glass transition temperature (Tg) is a value which is determined according to the method specified in JIS K 7121, employing DSC (Differential Scanning Colorimetry).

Typical examples of the known host compounds include those described in the following documents. For example, Japanese Patent O.P.I. Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Next, the light emission material will be explained.

A fluorescent compound) or a phosphorescence emission material (also referred to as a phosphorescent compound or a phosphorescence emission compound) can be used as the light emission material in the invention.

The phosphorescence emission material in the invention is a compound which emits light from the excitation triplet, can emit phosphorescence at room temperature (25° C.), and has a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. When the phosphorescence emission compound is used, it may be a compound in which the phosphorescent quantum yield measured employing any one of the solvents satisfies the above-described definition (not less than 0.01).

The light emission of the phosphorescence emission material is divided in two types in principle, one is an energy transfer type in which recombination of a carrier occurs on the host compound to which the carrier is transported to excite the host compound, the resulting energy is transferred to the phosphorescence emission material, and light is emitted from the phosphorescence emission material, and the other is a carrier trap type in which recombination of a carrier occurs on the phosphorescence emission material, which is a carrier trap material, and light is emitted from the phosphorescence emission material. However, in each type, it is necessary that the energy level of a phosphorescence emission material in an excited state is lower than that of the host compound in an excited state.

The phosphorescence emission material can be suitably selected from known ones used in the light emission layer of an organic EL element. The phosphorescence emission material is preferably a complex compound containing a metal belonging to groups 8 to 10 on the periodic table, and is more preferably an iridium compound, an osmium compound, a platinum compound (a platinum complex) or a rare earth complex, and most preferably an iridium compound.

Typical examples used in the phosphorescence emission material will be explained, but the invention is not specifically limited thereto. These compounds can be synthesized according to methods described in for example, Inorg. Chem., Vol. 40, 1704-1711 and the like.

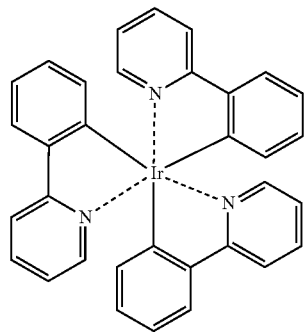

Ir-1

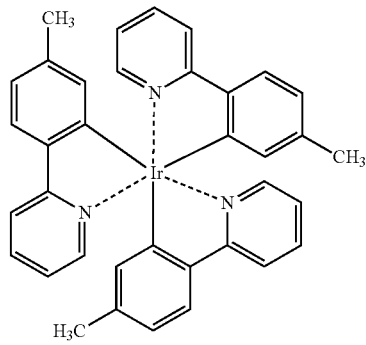

Ir-2

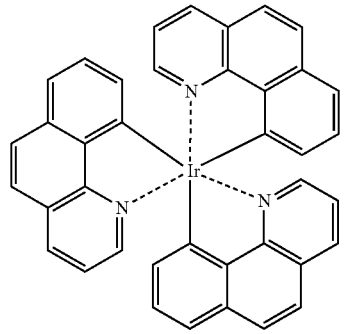

Ir-3

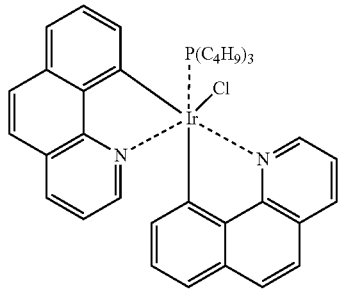

Ir-4

Ir-5
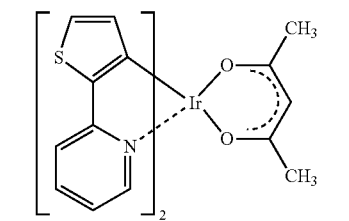
Ir-6
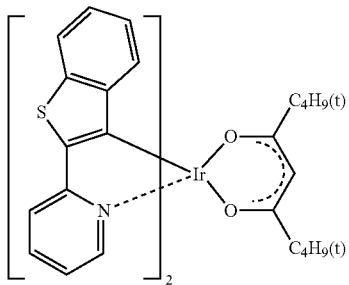
Ir-7
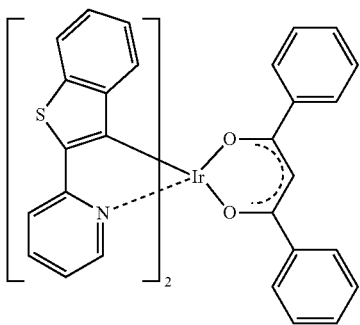
Ir-8
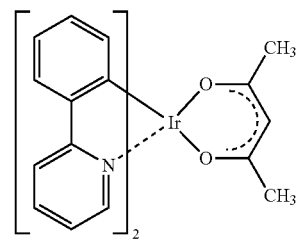
Ir-9
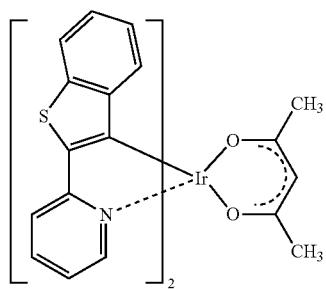
Ir-10
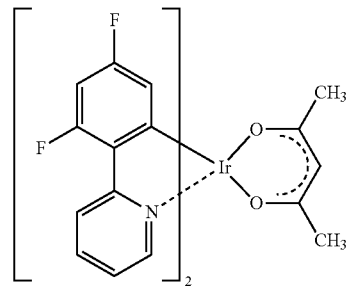
Ir-11
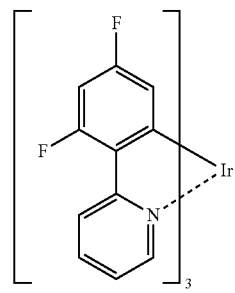
Ir-12
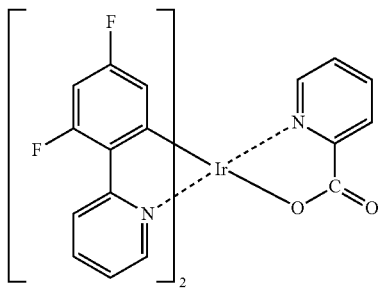
Ir-13
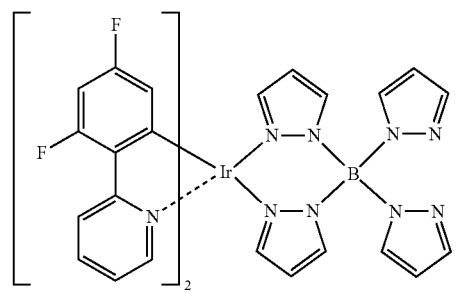
Ir-14
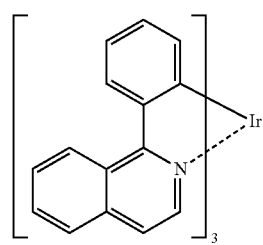

-continued
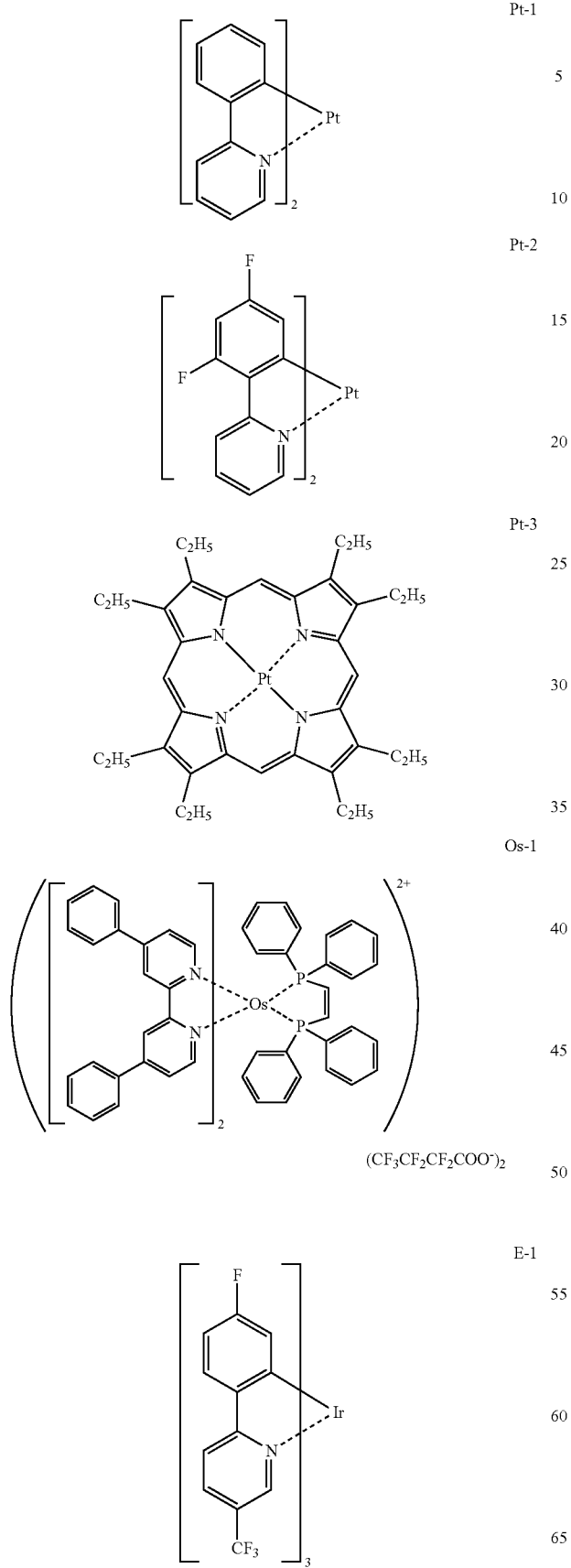
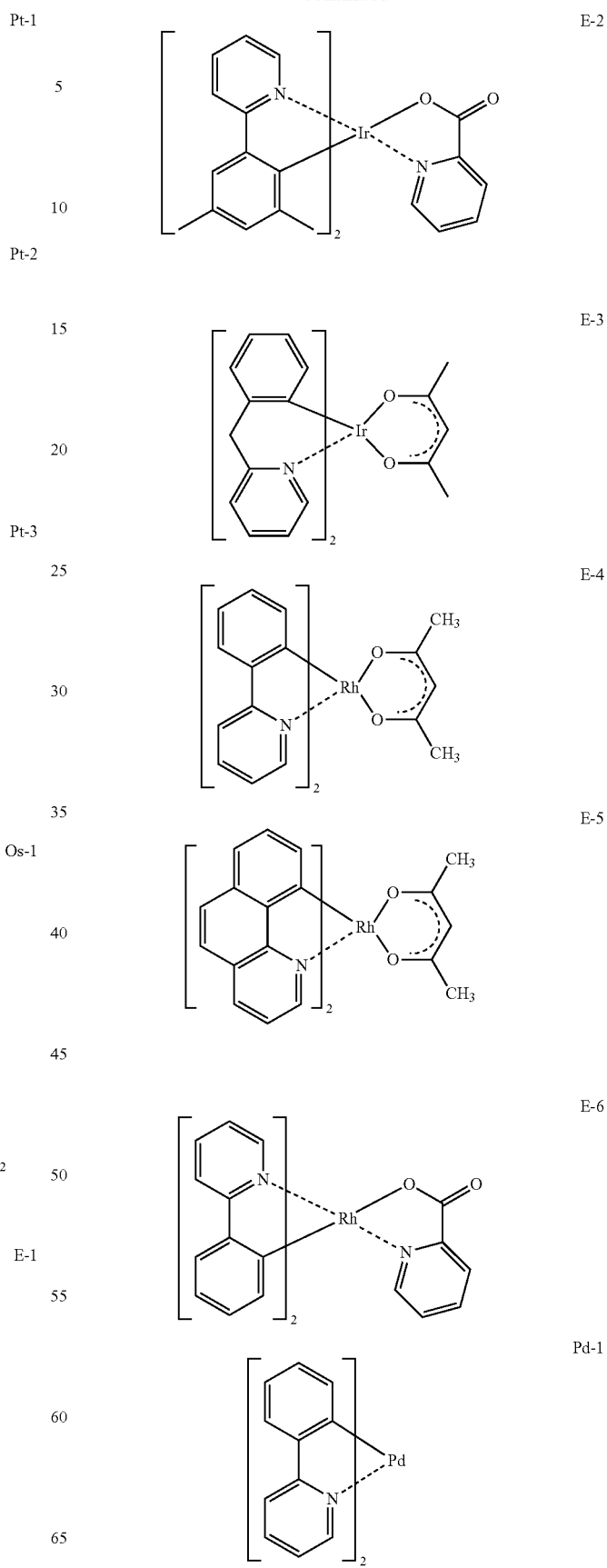

-continued

Pd-2 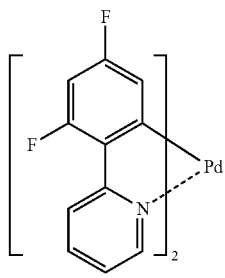

Pd-3 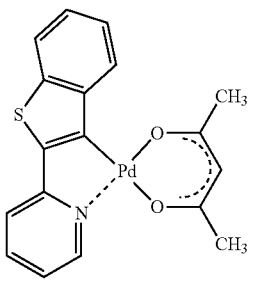

Rh-1 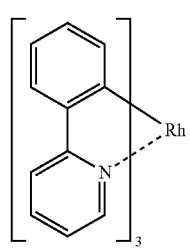

Rh-2 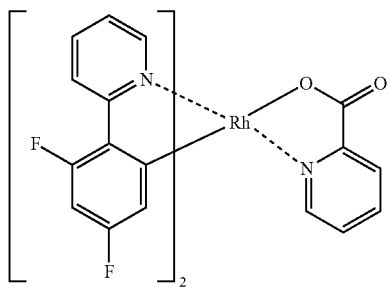

Rh-3 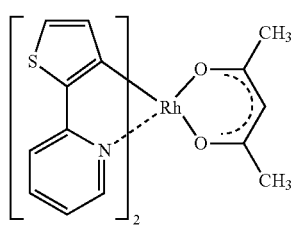

D-1 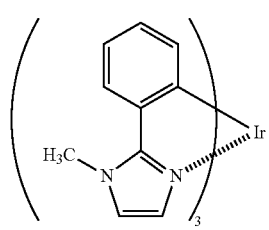

-continued

D-2 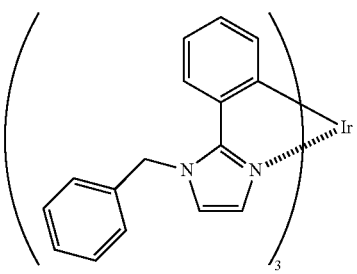

D-3 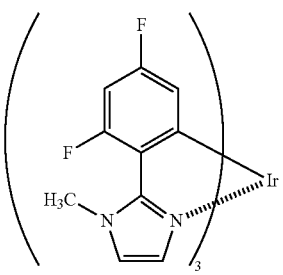

A fluorescence emission compound can be employed in the organic EL element in the invention. Typical examples of the fluorescence emission compound (fluorescent dopant) include a coumarin dye, a pyrane dye, a cyanine dye, a croconium dye, a squarylium dye, an oxobenzanthracene dye, a fluorescein dye, a rhodamine dye, a pyrylium dye, a perylene dye, a stilbene dye, a polythiophene dye and rare earth complex type fluorescent compound.

In the invention, two or more kinds of light emission materials may be used in at least one light emission layer, and the light emission material concentration in the light emission layer may vary in the thickness direction.

<Injection Layer: Electron Injection Layer, Hole Injection Layer>

The injection layer, for example, an electron injection layer or a hole injection layer, is optionally provided, and may be provided between the anode and the light emission layer or hole transport layer, and between the cathode and the light emission layer or electron transport layer, as described above.

The injection layer herein referred to is a layer provided between the electrode and an organic layer in order to reduce the driving voltage or to improve of light emission efficiency, which is detailed in "Electrode Material", Div. 2 Chapter 2, pp. 123-166 of "Organic EL element and its frontier of industrialization" (published by NTS Corporation, Nov. 30, 1998). As the injection layer there are a hole injection layer (an anode buffer layer) and an electron injection layer (a cathode buffer layer).

The anode buffer layer (hole injection layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injection layer) is described in Japanese Patent O.P.I. Publication Nos. 6-325871, 9-17574, and 10-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injection layer) is preferably very thin and has a thickness of preferably from 0.1 nm to 5 μm depending on kinds of the material used.

<Blocking Layer: Hole Blocking Layer, Electron Blocking Layer>

The blocking layer is a layer provided if necessary in addition to the fundamental constituent layer as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transport layer in a broad sense, and is comprised of material having an ability of transporting electrons but an extremely poor ability of holes, which can increase a recombination probability of electrons and holes by transporting electrons and blocking holes. Further, the constitution of an electron transport layer described later can be used in the hole blocking layer in the invention as necessary. The hole blocking layer is preferably provided to be in contact with a light emission layer.

On the other hand, the electron blocking layer is a hole transport layer in a broad sense, and is comprised of material having an ability of transporting holes but an extremely poor ability of electrons, which can increase a recombination probability of electrons and holes by transporting holes and blocking electrons. The constitution of the hole transport layer as described later can be used as that of the electron blocking layer. The thickness of the hole blocking layer or electron transport layer is preferably from 3 to 100 nm, and more preferably from 5 to 30 nm.

(Hole Transport Layer)

The hole transport layer is comprised of a hole transport material having an ability of transporting holes, and a hole injection layer and an electron blocking layer are included in the hole transport layer in a broad sense. The hole transport layer may be a single layer or plural layers.

The hole transport material has a hole injecting ability, a hole transport ability or an ability to form a bather to electrons, and may be either an organic substance or an inorganic substance. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer.

As the hole transport material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4% bis(diphenylamino)quardriphenyl, N,N,N-trip-tolyl)amine, 4-(di-p-tolylamino)-4'-[4-(di-p-tolylamino)styryl]stilbene, 4-N,N-diphenylamino(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injection material or the hole transport material, inorganic compounds such as p-type-Si and p-type-SiC are usable.

So-called p-type hole transport materials as disclosed in Japanese Patent O.P.I. Publication No. 11-251067 or described in the literature of J. Huang et al. (Applied Physics Letters 80 (2002), p. 139) are also applicable. In the present invention, these materials are preferably utilized since a light emission element exhibiting a higher efficiency is obtained.

The hole transport layer can be formed by layering the hole transport material by a known method such as a vacuum deposition method, a spin coat method, an extrusion coating method, or an ink jet method. The thickness of the hole transport layer is not specifically limited, but is ordinarily from 5 nm to 5 μm, and preferably from 5 to 200 nm. The hole transport layer may be composed of a single layer structure comprising one or two or more of the materials mentioned above.

A hole transport layer having high p-type property doped with impurity can be used. Examples thereof include those described in Japanese Patent O.P.I. Publication Nos. 4-297076, 2000-196140 and 2001-102175, and J. Appl. Phys., 95, 5773 (2004), and so on.

It is preferable in the invention to employ such a hole transport layer having high p-type property, since an element with lower power consumption can be prepared.

<Electron Transport Layer>

The electron transport layer comprises a material having an electron transporting ability, and in a broad sense refers to an electron injection layer or a hole blocking layer. The electron transport layer can be provided as a single layer or plural layers.

An electron transport material (which serves also as a hole blocking material) used in a single electron transport layer or in the electron transport layer closest to the cathode of plural electron transport layers has a function of incorporating electrons injected from a cathode to a light emission layer, and can be selected from known compounds. Examples thereof include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transport material. A polymer in which the material mentioned above is introduced in the polymer side chain or a polymer having the material as the polymer main chain can be also used.

A metal complex of an 8-quinolynol derivative such as aluminum tris-(8-quinolynol) (Alq$_3$), aluminum tris-(5,7- dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg, Cu, Ca, Sn, Ga or Pb, can be used as the electron transport material. Further, a metal free or metal-containing phthalocyanine, and a derivative thereof, in which the molecular terminal is replaced by a substituent such as an alkyl group or a sulfonic acid group, are also preferably used as the electron transport material. Furthermore, the distyrylpyrazine derivative exemplified as a material for the light emission layer may preferably be employed as the electron transport material, and an inorganic semiconductor such as n-type-Si and n-type-SiC may also be used as the electron transport material in a similar way as in the hole injection layer or in the hole transport layer.

The electron transport layer can be formed employing the above-described electron transport materials and a known method such as a vacuum deposition method, a spin coat method, an extrusion coating method, an ink jet method or a printing method. The thickness of the electron transport layer is not specifically limited, but is ordinarily from 5 nm to 5 μm, and preferably from 5 to 200 nm. The electron transport layer may be composed of a single layer comprising one or two or more of the electron transport material.

An electron transport layer having high n property doped with impurity can be utilized. Examples thereof include those described in Japanese Patent O.P.I. Publication Nos. 4-297076, 10-270172, 2000-196140, 2001-102175, and J. Appl. Phys., 95, 5773 (2004), and so on.

In the invention, it is preferred that such an electron transport layer having high n property is used, since it can provide an element with lower power consumption.

[Organic EL Structure Manufacturing Method]

As one embodiment of the organic EL structure manufacturing method in the invention, a manufacturing method of an organic EL structure composed of anode/hole injection layer/hole transport layer/light emission layer/hole blocking layer/electron transport layer/cathode will be explained below.

A film with a thickness of not more than 1 μm, and preferably from 10 to 200 nm, which is composed of an intended electrode material such as a material for anode, is provided on an appropriate supporting base plate via vapor deposition, sputtering or the like to form an anode. Subsequently, organic compound films, i.e., a hole injection layer, a hole transport layer, a light emission layer, a hole blocking layer and an electron transport layer are formed on the anode as component layers of the organic EL structure.

As methods for forming these organic compound films, there are mentioned a vapor deposition method, a spin coating method, an extrusion coating method, an ink jet method, and a printing method as described above. Among these, the vapor deposition method, the extrusion coating method, the ink jet method, and the printing method are especially preferred since uniform film is easy to form and pin holes are difficult to occur. Further, a different layer may be formed via a different layer formation method.

After formation of these layers, a cathode with a thickness of not more than 1 μm, and preferably from 50 to 200 nm, which is composed of a material for anode, is formed on the layers via a vapor deposition, sputtering or the like.

It is preferred that a hole injection layer through a cathode are continuously formed under vacuum in the manufacture of this organic EL structure, however, a different layer formation method may be carried out on the way of the manufacture, although it needs to be carried out, for example, under a dry inactive gas atmosphere.

The layer formation order as described above being reversed, a cathode, an electron injection layer, an electron transport layer, a hole injection layer, a light emission layer, a hole transport layer, a hole injection layer and an anode can be formed in that order.

[Sealing of Organic EL Element]

The invention is featured in forming an organic EL structure composed of a first electrode, at least one organic layer and a second electrode on a flexible substrate, and applying a flexible sealing substrate onto the resulting organic EL structure, followed by heating treatment, wherein a heating temperature, at which the heating treatment is carried out, is less than Tg (a glass transition temperature) of the substrate and not less than Tg (a glass transition temperature) of the sealing substrate. The difference in Tg between the substrate and the sealing substrate is from 30 to 50° C. Preferred combination of the substrate and the sealing substrate is a combination of oriented PEN and oriented PET, a combination of oriented PEN and cast PET, a combination of cast PEN and cast PET, or a combination of oriented PEN and cast PET. The temperature of the heating treatment is less than Tg of the substrate and not less than Tg of the sealing substrate, and its specific temperature is preferably from 100 to 140° C.

Sealing according to the flexible sealing substrate is carried out under circumstances in which air is purged by inactive gas to cover the cathode surface with the sealing substrate, whereby an organic EL element can be sealed. As the inactive gas, rare gas such as He or Ar, as well as $N_2$, is preferably employed. The content of the inactive gas in the air is preferably from 90 to 99.9% by volume. Sealing under circumstances in which air is purged by inactive gas improves storage stability.

(Sealing Substrate)

The sealing substrate in the invention seals an organic EL element, and protects the organic EL element from severe outside circumstances such as temperature change, humidity, oxygen or impact.

As the sealing substrate, the resin film as explained above in the substrate can be employed. Kinds and Tg of a resin for the resin film preferably employed in the invention are as follows.

| | |
|---|---|
| Polyethylene | −20° C. |
| Polypropylene | −20° C. |
| Polyvinyl chloride | 80° C. |
| Polystyrene | 100° C. |
| Polycarbonate | 150° C. |
| Cast PET | 80° C. |
| Cast PEN | 120° C. |
| Oriented PET | 110° C. |
| Oriented PEN | 155° C. |

Besides the above, nylon (Ny), nylon (KNy) coated with vinylidene chloride (PVDC), polypropylene (KOP) coated with PVDC, cellophane (KPt) coated with PVDC, or ethylene-vinyl alcohol copolymer (Eval) can be employed as the resin for the resin film. A multi-layered resin film can be employed which is obtained by co-extruding these resin films together with a different film or adhering these resin films onto a different film varying an oriented angle, as necessary. Further, in order to obtain a required property of a material for a package, a density and a molecular weight distribution of the film are combined. In the invention, Tg of the sealing substrate composed of a multi-layered resin film is defined as Tg of the resin having the lowest Tg among the resins constituting the multi-layered resin film.

The thickness of the sealing substrate is not generally defined, but is preferably from 3 to 300 μm, more preferably from 5 to 200 μm, and still more preferably from 10 to 100 μm.

It is preferred that a barrier film is formed on the sealing substrate. Examples of the barrier film include a metal deposition film, a metal foil and an inorganic deposition film. A metal foil is preferred as the barrier film since it is likely to conform to the shape of the sealing substrate when the barrier film is adhered to the sealing substrate. The thickness of the barrier film is preferably from several microns to 50 μm, although it depends on material used in the barrier film.

The metal used in the metal foil film or the metal deposition film is not specifically limited to the kinds, but examples of the metal include copper (Cu), aluminum (Al), gold (Au), brass, nickel (Ni), titanium (Ti), a copper alloy, stainless steel, tin (Sn), and a high nickel content metal alloy. Among these, aluminum is most preferred in view of a barrier property (humidity permeability and oxygen permeability) and cost.

As an inorganic film, for example, silicon oxide, silicon dioxide, or silicon nitride can be employed. It is more preferred that the barrier film has a multi-laminated layer structure composed of a layer of the inorganic material and a layer of an organic material for improving fragility of the film. It is preferred that the both layers are alternatively laminated several times though there is no limitation as to the lamination order of the inorganic layer and the organic layer.

The barrier film of the sealing substrate is preferably one with a barrier ability having an oxygen permeability of not more than $10^{-3}$ g/(m²·day) and a vapor permeability of not more than $10^{-3}$ g/(m²·day). It is still more preferred that both the vapor permeability and the oxygen permeability are not more than $10^{-5}$ g/(m²·day).

(Adhesive)

As the adhesive for adhesion of sealing substrate, there is mentioned a heat curable adhesive containing a reactive vinyl group such as an acryl type oligomer or a methacryl type oligomer. As the adhesive, Three Bond 1152 or 1153 is commercially available.

The organic EL element is degraded by heat treatment in some cases, and therefore, an adhesive, which is cured at a temperature of not less than Tg of the substrate and at a temperature of less than Tg of the sealing substrate within one hour, is preferred. For example, when oriented polyethylene naphthalate (Tg: 155° C.) terephthalate is employed as the substrate and oriented polyethylene terephthalate ((Tg: 110° C.)) as the sealing substrate, an epoxy type heat curable adhesive, which is cured at 120° C. within one hour, is employed as the adhesive.

It is preferred that a layer comprising an inorganic or organic material is formed as a sealing layer on an electrode placed on the side facing a substrate an organic layer provided between the substrate and the electrode, so as to cover the electrode and the organic layer and contact with the substrate. In such a case, a material for forming the sealing layer may be a material having a function to inhibit permeation of a substance such as water and oxygen causing degradation of the element, and for example, silicon oxide, silicon dioxide and silicon nitride are usable. The sealing layer preferably has a multi-laminated layer structure composed of a layer of the inorganic material and a layer of an organic material for improving fragility of the layer. The method for forming the layer is not specifically limited and, for example, a vacuum deposition method, a spattering method, a reaction spattering method, a molecule beam epitaxy method, a cluster-ion beam method, an ion plating method, a plasma polymerization method, an atmospheric pressure plasma polymerization method, a plasma CVD method, a laser CVD method, a heat CVD method and a coating method are applicable.

[Manufacturing Apparatus of Organic EL Structure]

One embodiment of a manufacturing apparatus of the organic EL structure in the invention and a manufacturing method employing the same will be explained, referring to FIG. 3.

Figure 3:
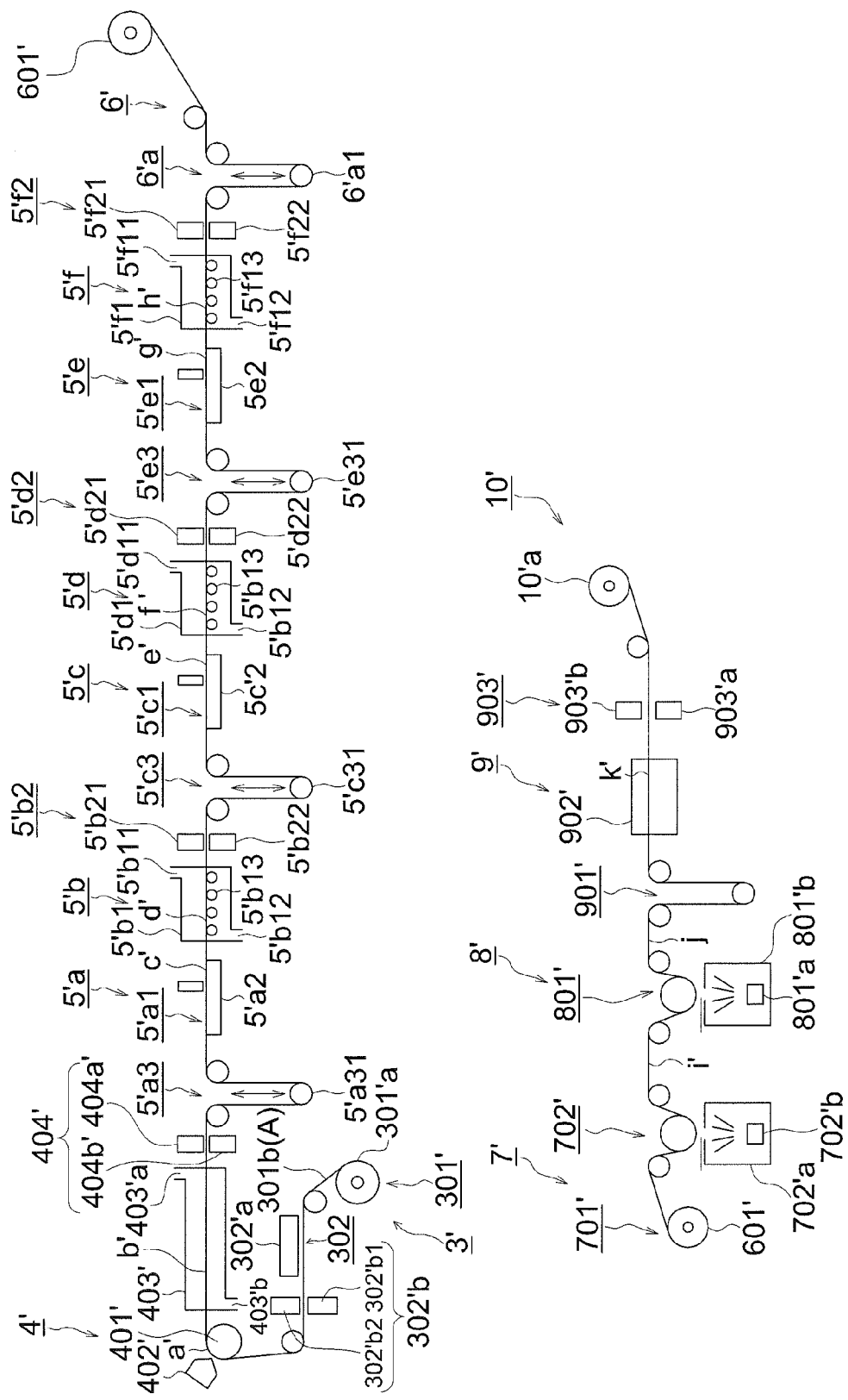
FIG. 3 is a schematic view of a manufacturing apparatus and a manufacturing process of the organic EL element in the invention.

FIG. 3 is a schematic view showing a manufacturing apparatus and a manufacturing process for manufacturing an organic EL structure comprising a substrate with a multilayered structure provided thereon. Explanation of the manufacturing apparatus shown in this figure will be made for the case of an organic EL element, in which a gas barrier layer, a first electrode, a hole transport layer, a light emission layer, an electron injection layer, a second electrode and a sealing layer are formed in this order on a flexible substrate, as an example of an organic EL element. Herein, in this figure, a first electrode forming step is omitted because a flexible substrate on which a gas barrier layer and a first electrode have been already formed is utilized.

The manufacturing process comprises a substrate supply step 3', a hole transport layer formation step 4' for forming a hole transport layer, a light emission layer formation step 5' for forming a light emission layer, a first recovery step 6', an electron injection layer formation step 7' for forming an electron injection layer, a second electrode formation step 8' for forming a second electrode, a sealing layer formation step 9' for forming a sealing layer, and a second recovery step 10'. In the manufacturing process as shown in this figure, a process is shown in which the substrate supply step 3' to the light emission layer formation step 5' are carried out continuously under an atmospheric pressure, take-up is temporally carried out under an atmospheric pressure, and then the electron injection step 7' to the sealing layer formation step 9' are carried out continuously under reduced pressure. The second recovery step 10' may be carried out under atmospheric pressure or reduced pressure.

The supply step 3a' comprises an unwinding step 301' and a surface treatment step 302'. In the unwinding step 301', supply of a substrate 301'b (hereinafter also referred to as substrate A) is carried out in which a gas barrier layer used for forming at least one organic EL element and at least one anode layer including a first electrode have been already formed on a substrate in this order and wound on a core to be in the roll form. The symbol 301' a shows a master roll of the substrate 301' b. The surface treatment step 302' is provided with a washing modification surface treatment device 302'a and a first antistatic means 302' b. As the washing modification surface treatment device 302'a, which washes and modifies the first electrode (not illustrated) surface of the substrate A fed from the unwinding step 301' before a coating solution for hole transport layer formation is coated, a low pressure mercury lamp, an excimer lamp, a plasma washing apparatus and the like are preferably employed. As the washing modification surface treatment conducted employing a low pressure mercury lamp, there is for example a surface washing modification treatment conducted by irradiation with a low pressure mercury lamp having a wavelength of 184.2 nm at an irradiation intensity of 5 to 20 mW/cm² and at a distance of 5 to 15 mm. As the washing modification surface treatment via a plasma washing device, for example, atmospheric pressure plasma is preferably employed. As the washing condition, there is mentioned one in which washing modification surface treatment is conducted at a frequency of 100 kHz to 150

MHz, at a voltage of 10 V to 10 kV and at a distance of 5 to 20 mm, employing an argon gas containing oxygen in an amount of from 1 to 5% by volume.

The first antistatic means 302'b is composed of a non-contact type antistatic device 302'b1 and a contact type antistatic device 302'b2. As the non-contact type antistatic device 302'b1, there is, for example, a non-contact type ionizer. The types of the ionizer are not specifically limited, and the ion generation method may be either an AC method or a DC method. Those of the AC type, the double DC type, the pulse AC type and the soft X ray type can be utilized; and one of the AC type is especially preferred in view of with precise charge neutralization. As an ejection gas required when one of the AC type is employed, air or $N_2$ is utilized, and a sufficiently purified $N_2$ is preferably utilized. Further, one of the blower type or the gun type is preferably selected in view of in-line processing.

As the contact type antistatic device 302'b2, a charge neutralization roll or a grounded conductive brush is employed. The charge neutralization roll as a charge neutralizer is grounded and contacts a surface to be neutralized while rotating freely to neutralize the surface charge. As such a charge neutralization roll, an elastic roll made of plastics or rubbers which have been blended with conductive materials such as carbon black, metal powder and metal fiber, as well as a roll made of metals such as aluminum, copper, nickel and stainless, is utilized. Particularly, those having elasticity are preferred in achieving the good contact with a band-form flexible continuous sheet. As the grounded conductive brush, there is generally mentioned a brush member composed of a linearly arranged conductive fiber, a charge neutralization bar having a brush made of a linear metal or one having a charge neutralization string structure. The charge neutralization bar is not specifically limited, and a corona discharge type one such as SJ-B manufactured by Keyence Corp. is preferably utilized. The charge neutralization string also is not specifically limited, and generally, one in the flexible string form is preferably utilized.

The non-contact type antistatic device 302'b1 is preferably utilized on the first electrode surface side of the flexible substrate A and the contact type antistatic device 302'b2 is preferably utilized on the rear surface side of the flexible substrate A. Since charge neutralization of the substrate is carried out by the first antistatic means to prevent dust adhesion and dielectric breakdown, the yield of the element is improved.

In the hole transport layer formation step 4', there are provided a backup roll 401' to support the substrate A; a wet coater 402' to coat a coating solution for hole transport layer formation on the substrate A supported on the backup roll 401' except for an external pick-up terminal forming portion of the first electrode; and a drying device 403' comprising a drying air supply inlet 403'a for removing the solvent of the hole transport coating layer a' formed on the first electrode (not illustrated) on the substrate A to form a hole transport layer b', an air exhaust outlet 403'b and a transport roll 403' c. The drying device 403 has a part capable of carrying out heat application treatment in the inner portion.

The symbol 404' shows a second charge neutralization treating means for neutralizing a charge of the hole transport layer b'. The second charge neutralization treating means 404' also is composed of a non-contact type antistatic device 404'a and a contact type antistatic device 404'b, as is the case with the first charge neutralization treating means 302'b.

The light emission layer formation step 5' comprises a first coating step 5'a, a first drying step 5'b, a second coating step 5'c, a second drying step 5'd, a third coating step 5'e, and a third drying step 5'f. In the first coating step 5'a, there are provided a static nozzle ejecting device 5'a1 as a first liquid droplet ejecting means, a supporting member 5a2, and a first accumulator portion 5'a3. In the first coating step 5'a, liquid droplets ejected from the static nozzle ejecting device 5'a1 are deposited on the hole transport layer in a given interval of time to form a coating c' for a discontinuous light emission layer formation (a coating for a discontinuous second organic functional layer formation). Herein, a static nozzle ejecting device is employed as a coating means, but other well known coating devices may be employed. (For example, a continuous coating layer is formed employing an extrusion coating device, and a part of the coating layer is wiped off employing a wiping device to form a discontinuous coating layer.)

The first accumulator portion 5'a3 is provided so that the difference in transporting speed between the hole transport layer formation step 4' and the first coating step 5'a is adjusted by allowing the roll 5'a31 to move up and down (in the direction of the arrow as shown in the figure, and the roll 5'a31 can be increased according to their transporting speed difference.

In the first drying step 5'b, there are provided a drying device 5'b1 comprising a drying air supply inlet 5'b11, an air exhaustion outlet 5'b12 and a transport roll 5'b13; and a third charge neutralization treatment means 5'b2 for neutralizing a charge of a coating c' for a discontinuous light emission layer formation. The third charge neutralization treatment means 5'b2 also is composed of a non-contact type antistatic device 5'b21' and a contact type antistatic device 5'b22, as is the case with the first charge neutralization treating means 302'b. The drying device 5'b1 has a part capable of carrying out heat application treatment in the inner portion. The solvent of the coating c' for the discontinuous light emission layer formation (the coating for a discontinuous second organic functional layer formation) is removed in the drying device 5'b1 to form a discontinuous light emission layer (a discontinuous second organic functional layer).

In the second coating step 5'c, there are provided a static nozzle ejecting device 5'c1 as a second liquid droplet ejecting device, a supporting member 5'c2, and a second accumulator portion 5'c3. In the second coating step 5'c, liquid droplets ejected from the static nozzle ejecting device 5'c1 are deposited on uncoated portion of a discontinuous light emission layer d' (a discontinuous second organic functional layer formation) formed in the first coating step 5'a to form a coating e' for a continuous light emission layer formation (a coating for a second continuous organic functional layer formation). Herein, a static nozzle ejecting device is employed as a coating means, but other well known coating devices may be employed. (For example, a continuous coating layer is formed employing an extrusion coating device, and a part of the coating layer is wiped off employing a wiping device to form a discontinuous coating layer.)

The second accumulator portion 5'c3 is provided so that the difference in transporting speed between the first coating step 5'a and the second coating step 5'c is adjusted by allowing the roll 5'c31 to move up and down (in the direction of the arrow as shown in the figure), and the roll 5'a31 can be increased according to their transporting speed difference. In the second drying step 5'd, there are provided a drying device 5'd1 comprising a drying air supply inlet 5'd11, an air exhaust outlet 5'd12 and a transport roll 5'd13; and a fourth charge neutralization treatment means 5'd2 for neutralizing a charge of the continuous light emission layer f formed. The fourth charge neutralization treatment means 5'd2 also is composed of a non-contact type antistatic device 5'd21' and a contact type antistatic device 5'd22, as is the case with the first charge neutralization treating means 302'b. The drying device 5'd1 has a part capable of carrying out heat application treatment in the inner portion.

In the third coating step 5' e, there are provided a static nozzle ejection device 5'e1 as a second liquid droplet ejection device, a supporting member 5'22, and a second accumulator portion 5'e3. The third accumulator portion 5'e3 is provided so that the difference in transporting speed between the second coating step 5'c and the third coating step 5'e is adjusted by allowing the roll 5'e31 to move up and down (in the direction of the arrow as shown in the figure), and the roll 5'e31 can be increased according to their transporting speed difference. In the third coating step 5' e, liquid droplets, which are those of the same solvent as used in a coating solution for the light emission layer formation, are ejected from the static nozzle ejection device 5'e1 and deposited on the continuous light emission layer f' formed above to form a solvent coating layer g'. Incidentally, it is preferred that the static nozzle ejection device 5'a1, the static nozzle ejection device 5'c1 and the static nozzle ejection device 5'e1 are provided on a frame (not illustrated) so that they are capable of moving in the width direction of the substrate. Herein, a static nozzle ejection device is employed as a coating means, but other well known coating devices may be employed. (For example, a continuous coating layer is formed employing an extrusion coating device, and a part of the coating layer is wiped off employing a wiping device to form a discontinuous coating layer.)

In the third drying step 5'f, there are provided a drying device 5'f1 comprising a drying air supply inlet 5'f11, an air exhaust outlet 5'f12 and a transport roll 5'f13; and a fourth charge neutralization treatment means 5'2 for neutralizing a charge of the continuous light emission layer h' formed. The fourth charge neutralization treatment means 5'f2 also is composed of a non-contact type antistatic device 5'f21' and a contact type antistatic device 5'f22, as is the case with the first charge neutralization treating means 302'b. The drying device 5'f1 has a part capable of carrying out heat application treatment in the inner portion.

A solvent of the solvent coating layer g' is the same as employed in a coating solution for the light emission layer formation, and the continuous light emission layer f' (the continuous second organic functional layer), before the solvent is removed in the drying device 5'11, is in the form of solution in which unifying and leveling of the continuous light emission layer f' (the continuous second organic functional layer) occurs to form a uniform continuous light emission layer h'. Incidentally, the third coating step 5'e and the third drying step 5'f are preferably provided in order to further unify the continuous light emission layer, and can be optionally provided as necessary.

In a first recovery step 6', there are provided a fourth accumulator portion 6'a, and a winding device (not illustrated). A substrate with the continuous light emission layer h' formed thereon (hereinafter also referred to as a substrate B) is wound around a core and recovered as a substrate B601' in the roll form. The fourth accumulator portion 6'a is provided so that the difference in transporting speed between the third coating step 5'e and the first recovery step 6' is adjusted by allowing the roll 6'a1 to move up and down (in the direction of the arrow as shown in the figure), and the roll 6'a1 can be increased according to their transporting speed difference.

In the electron injection layer formation step 7', there are provided a supply portion 701' and an electron injection layer formation portion 702'. In the supply step 701', the substrate B61' in the roll form which has been prepared in the previous step is unwound and supplied to the electron injection layer formation portion 702'. In the electron injection layer formation step 702', an electron injection layer i' is formed on the continuous light emission layer h'. The symbol 702'a is a vapor deposition device and the symbol 702'b is a vapor deposition source container. A flexible substrate with the electron injection layer i' formed thereon is successively supplied to a second electrode formation step 8'.

In the second electrode formation step 8', a second electrode j' is formed on the electron injection layer i' which has been formed in the electron injection layer formation step 702'. The symbol 801' a shows a vapor deposition device and the symbol 801'b is a vapor deposition source container.

A flexible substrate with the second electrode j' formed thereon is successively supplied to a protective layer formation step 9'. In the protective layer formation step 9', there are provided a fifth accumulator portion 901' a protective layer formation device 902', and a fifth antistatic means 903'. The fifth antistatic means 903' also is composed of a non-contact type antistatic device 903'a and a contact type antistatic device 903'b, as is the case with the first charge neutralization treating means 302'b. The second electrode j' having been formed in the second electrode formation step 8, a protective layer k' is formed on the second electrode j' except for the ends thereof, employing the protective layer formation device 902', whereby at least one organic EL element is formed on the substrate.

In the recovery step 10', there is employed a winding device (not illustrated). In the recovery step 10, a flexible substrate on which at least one organic EL element has been formed (hereinafter also referred to as a flexible substrate c) is wound around a core with the protective layer k' directed inwardly, employing a winding device (not illustrated), and recovered. The symbol 10' a shows a substrate in the roll form which is obtained by winding the flexible substrate C around a core and recovering it as a roll. The resulting substrate in the roll form is preferably stored under conditions of an oxygen concentration of from 1 to 100 ppm and a moisture concentration of from 1 to 100 ppm, in view of maintaining the performance.

In the above, an example, in which a protective layer is formed on the organic EL structure before sealing, is shown above, but the protective layer need not always be formed.

In coating according to the static nozzle ejection device 5'a1 in the first coating step 5'a, coating according to the static nozzle ejection device 5'c1 in the second coating step 5'c, and coating according to the static nozzle ejection device 5'e1 in the first coating step 5'e as shown in this figure, the static nozzle ejection device 5'a1, the static nozzle ejection device 5'c1 and the static nozzle ejection device 5'e1 move in the width direction of the substrate in accordance with the substrate transporting speed.

In this figure, it has been shown that the electron injection layer formation step 7' and the second electrode formation step 8' are carried out employing a vapor deposition device. However, formation of the electron injection layer or the second electrode can be carried out employing a method other than the vapor deposition. Further, instead of the sealing layer formation as shown in this figure, a sealing film lamination method may be carried out.

A coating solution for a hole transport layer formation and a coating solution for a light emission layer formation employed in the manufacturing method as shown in FIG. 5 contain at least one kind of an organic compound material and at least one kind of a solvent, and the surface tension thereof is preferably from $15 \times 10^{-3}$ to $55 \times 10^{-3}$ N/m, considering repellency spots and coating unevenness occurring at the time of coating.

In the steps as shown in FIG. 5 to form a hole transport layer and a light emission layer which are the constituent layers of an organic EL element, those layers are preferably formed at a dew point of not higher than −20° C., at a cleanliness degree of not higher than class 5, and at a temperature of 10 to 45° C. under atmospheric pressure except for a temperature in the drying step, in view of maintaining performances of the hole transport layer and light emission layer and of preventing defects due to foreign matter adhesion, the cleanliness degree being measured based on JISB 9920.

<Sealing Substrate Adhesion Step and Cutting Step>

FIG. 4 is a schematic view showing on example of a sealing substrate layer formation step 140 and a cutting step 150.

The sealing substrate layer formation step 140 comprises an adhesion step 142 and a curing step 143.

In the adhesion step 142, the sealing substrate 16B with the adhesion layer 16A is adhered to the substrate 11 while pressing via a roller to form, on the organic EL structure, the sealing substrate layer 16 comprising the sealing substrate 16B.

In this step, electrode pick-up portions (E1 and E2 in FIG. 2), which are not covered with the sealing substrate layer, are formed.

As an adhesive used in the adhesion layer, there is mentioned a heat curable adhesive such as an epoxy, acryl or acrylurethane based adhesive which is heated and cured by a heating means, or an ultraviolet ray curable adhesive which is irradiated with ultraviolet rays employing an ultraviolet ray irradiation means and cured. A heat curable adhesive is preferably employed.

In the curing step 143, the adhesion layer 16A is heated by means of a heating means 143A and cured, whereby the sealing layer 16 is fixed onto the upper surface of the organic EL structure. Incidentally, when an ultraviolet ray curable type adhesive is employed, the adhesive is cured with UV light irradiation.

The curing step 143 may be carried out before or after the cutting step, and is preferably carried out after the cutting step in view of production efficiency.

The cutting step 150 is one in which the substrate with a sealing substrate layer 16 formed thereon is cut at a predetermined position to obtain an individual organic EL element.

In the cutting step 150, a cutting means 151A is employed. The long length substrate 11 with the organic EL structure and the sealing substrate layer is cut by means of the cutting means 151A in the cutting step 150 to obtain an organic EL element. The thus obtained organic EL element comprises a first electrode, a hole transport layer, an organic light emission layer, a second electrode, an electron injection layer and a sealing substrate layer.

The cutting means 151A may be a guillotine cutter moving up and down or a circular rotation cutter minimizing vibration.

With respect to the position at which cutting is carried, cutting is carried out along the cutting line A in the width direction of the long length substrate as shown in FIG. 2. Herein, the distance between the cutting line A and a pickup portion of the first and second electrodes is preferably not less than 2 mm in view of a gas barrier property of the adhesion layer and prevention of short circuit of the electrodes. One obtained by being cut along the cutting line is an individual organic EL element.

EXAMPLES

Next, the embodiment of the present invention will be explained referring to examples, but the present invention is not specifically limited thereto.

<Preparation of Organic EL Element 1>

(Formation of First Electrode)

A substrate (obtained by a method in Example 1 of Japanese Patent O.P.I. Publication No. 2007-83644), in which a barrier layer is formed on a polyethylene naphthalate film with a thickness of 100 μm, a width of 200 mm and a length of 500 m (manufactured by Teijin Co., Ltd., hereinafter abbreviated as PEN), was provided. The substrate was in advance provided with an alignment mark to show a position at which a first electrode was to be formed, and a 120 nm thick ITO (indium oxide) was formed on the substrate under a vacuum pressure of $5 \times 10^{-1}$ Pa according to a mask pattern layer formation employing a spattering method. Thus, 12 rows of first electrodes with a size of 10 mm×10 mm were continuously formed on the substrate at a given interval, in which the electrode pickup portions were located on the ends in the width direction of the substrate. Then, the resulting substrate was wound up.

(Formation of First Hole Transport Layer)

A solution, in which polyethylenedioxythiophene-polystyrene sulfonate (PSDOT/PSS, produced by Bayer Co., Ltd, Bytron P AI 4083) was diluted with pure water and methanol to contain 65% of pure water and 5% by weight of methanol, was coated as a coating solution for a first hole transport layer formation on the entire surface of the substrate (except for portions 10 mm distant from the both ends thereof) via an extrusion applicator to obtain a dry thickness of 30 nm, dried and heated to form a first hole transport layer.

Coating Condition

Coating of the coating solution for the first hole transport layer formation was carried out under a $N_2$ gas atmosphere at a temperature of 25° C., at a dew point of not higher than −20° C., at atmospheric pressure and at a cleanliness degree of not higher than class 5 (measured based on JISB 9920).

(Patterning of First Hole Transport Layer: Removal Step 1)

The substrate with the first hole transport layer was irradiated with a microwave (2.45 GHz), whereby the position of the first electrode was detected as a thermal pattern which was employed as a position-determining mark. Thereafter, methyl ethyl ketone, which is a good solvent of the hole transport layer and is capable of swelling the hole transport layer, was supplied onto the hole transport layer at pickup portions of the first electrode, and at unnecessary portions around the first electrode, and then rubbed with a wiping head (a press roller or a tape-shaped member) at a pressing pressure of $1.96 \times 10^5$ Pa and at a relative speed of the wiping head to the substrate of 5 cm/second in a weeping device as shown in FIG. 5, the temperature inside the weeping device being maintained at 10° C., whereby layers formed between the organic EL structures were continuously wiped off and removed. The vapor pressure of methyl ethyl ketone is 4173 Pa at 5° C. As the microwave irradiation device, pi-reactor produced by Shikoku Keisoku Kogyo Co., Ltd., was employed.

After the first hole transport layer to be wiped off was removed, the resulting substrate was dried and temporarily wound up. Incidentally, the solvent was supplied in an amount of 10 ml/minute at a temperature of 10° C.

Subsequently, as described later, coating via an extruder, drying and winding up were repeated, thereby forming a second hole transport layer, an organic light emission layer and an electron transport layer in that order. The transport speed was 3 m/minute.

(Second Hole Transport Layer)

A solution, in which 50 mg of a hole transport material 1 (described later) was dissolved in 10 ml of toluene, was coated on the substrate by means of an extruder, dried, and subjected to ultraviolet ray irradiation for 180 seconds under nitrogen atmosphere for photopolymerization/cross-linking, thereby forming a second hole transport layer with a thickness of about 20 nm.
(Organic Light Emission Layer)

A toluene solution containing PVK in amount of 1% by mass and dopant 4 in an amount of 0.1% by mass was coated on the second hole transport layer via an extruder, and dried at 120° C. to form a light emission layer with a thickness of about 50 nm.
(Electron Transport Layer)

A 1-butanol solution containing an electron transport material 1 in an amount of 0.5% by mass was extrusion coated on the light emission layer, and dried at 60° C. to form an electron transport layer with a thickness of about 15 nm.

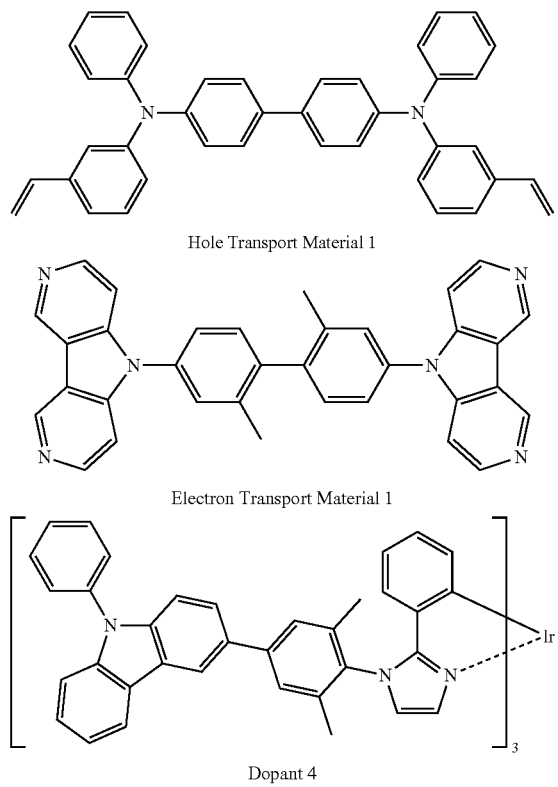

Hole Transport Material 1

Electron Transport Material 1

Dopant 4

The coatings above were carried out under a $N_2$ gas atmosphere at a temperature of 25° C., at a dew point of not higher than −20° C., at atmospheric pressure and at a cleanliness degree of not higher than class 5 (measured based on JISB 9920).
(Patterning of Organic Layers: Removal Step 2)

The wound substrate with the first hole transport layer was supplied, and the first electrode pattern formed on the substrate being employed as a position-determining mark, position determination was determined by means of a microwave sensor. Thereafter, a mixture solvent, in which o-xylene having high affinity to the second hole transport layer and the light emission layer and 1-butanol being a good solvent of the electron transport layer were mixed in a mixed ratio of 2:1, was supplied onto the layers at pickup portions of the first electrode and at unnecessary portions around the first electrode, and then rubbed at a temperature of 15° C. in a weeping device as shown in FIG. 7, and at a relative speed of the press roller (tape-shaped member) to the substrate of 5 cm/second in the same way as described previously, whereby the layers at those portions were continuously wiped off and removed. Herein, the pressing pressure of the wiping head was $1.96 \times 10^5$ Pa, the temperature in the interior of the wiping device was cooled to 15° C. at the time of the wiping of and the total supply amount of the solvent was 20 ml/minute.

The vapor pressure of 1-butanol is 368 Pa at 15° C., and that of o-xylene is 475 Pa at 15° C.

According to the above processing, the three organic layers having been swelled or dissolved were simultaneously rubbed and removed, whereby patterning was carried out. After patterning, the resulting product was dried in a drying device, temporarily wound, and allowed to stand for one hour.

Subsequently, a cathode buffering layer (electron injection layer), a second electrode, and a sealing layer were formed on the organic layer in that order under conditions described later, cut and subjected to heating treatment. Thus, an organic EL panel sample No. 1 was prepared.
(Formation of Cathode Buffering Layer (Electron Injection Layer))

According to the position of the anode of the roll-shaped substrate with the patterned organic layers formed thereon, LiF was deposited onto the electron transport layer and on the portions except for the pickup portions of the first electrode under a vacuum pressure of $5 \times 10^{-4}$ Pa in a vapor deposition device employing a mask pattern deposition method, thereby forming a cathode buffering layer (electron injection layer) with a thickness of 0.5 nm.
(Formation of Second Electrode)

Successively, according to the size of first electrode, aluminum was deposited onto the cathode buffering layer (electron injection layer) under a vacuum pressure of $5 \times 10^{-4}$ Pa employing a mask pattern vapor deposition method, so that the second electrode pickup portion was provided on the side opposite the first electrode pickup portion, thereby forming a second electrode composed of a 100 nm thick aluminum layer. Thus, an organic EL structure was prepared.
(Adhesion of Sealing Substrate)

Subsequently, alignment marks with which the substrate with the organic EL structure was marked were detected, and a long length sealing substrate with an adhesive layer was adhered onto a portion of the substrate except for the pickup portions of the first and second electrodes according to positions of the alignment marks.

A device as shown in FIG. 4 was employed in the adhesion of the length sealing substrate, and a 50 μm thick PET film with a 30 μm thick aluminum foil as a barrier film laminated thereon was employed as the sealing substrate.

A heat curable adhesive having a melting point of 120° C. was employed as an adhesive for the adhesive layer, and the thickness of the adhesive layer was 30 μm.
(Heat Curing)

After adhesion of the sealing substrate, curing was carried out at 100° C. for one hour.
(Cutting)

Subsequently, the alignment marks showing an individual organic EL element size being detected, the substrate with plural organic structures obtained above was cut into an individual organic EL element according to the positions of the alignment marks detected. Thus, an organic EL element 1 was prepared.
<<Preparation of Organic EL Elements 2 through 15>>

Organic EL elements 2 through 15 were prepared in the same manner as organic EL element 1, except that resin for the substrate, resin for the sealing substrate and heating temperature after the sealing substrate adhesion each were changed to those as shown in Table 1.

<<Evaluation of Organic EL Elements>>

The resulting organic EL elements were evaluated for emission unevenness and emission efficiency.

(Emission Unevenness)

A direct current voltage was applied to each of the organic EL elements, employing Source-Measure Unit 2400 Type produced by KEITHLEY Co., Ltd. to produce light emission at 200 cd/cm². The emission unevenness was observed by means of a 50 power microscope, and evaluated according to the following criteria.

A: No emission unevenness was observed.

B: A slight emission unevenness was observed which was not practically problematic. D: Emission unevenness was observed in which uniform emission portions were less than 70% and which was practically problematic.

(Emission Area (Barrier Property))

The organic EL elements were stored at 25° C. under reduced pressure 33330 Pa for 24 hours and further stored under accelerated deterioration conditions (at 60° C. and at 90% RH for 250 hours). Thereafter, the area of emission portions other than non-emission portions such as dark spots was determined. The ratio of the emission area obtained to the initial emission area was evaluated according to the following criteria:

A: The ratio was from 95% to 100%.
B: The ratio was from 90% to less than 95%.
C: The ratio was from 85% to less than 90%.
D: The ratio was less than 85%.

The results are shown in Table 1.

EL element 2 of Example 1, except that after the hole injection layers were formed, the following power generation layer coating solution was coated thereon, and dried at 120° C. to provide a dry thickness of 150 nm.

(Power Generation Layer Coating Solution)

As the power generation layer coating solution, a solution was employed, in which regioregular P3HT (poly-3-hexylthiophene) having a number average molecular weight of 45000 and a fullerene derivative PCBM (6,6-phenyl-C61-methyl butyrate) (1:1 by mass) was dissolved in a total amount of 3% by mass in 6 ml of chlorobenzene. The coated layer was dried under a nitrogen atmosphere while slowly transporting in a 140° C. drying zone to form a power generation layer with a dry thickness of 150 nm.

When the resulting organic photoelectric conversion element with a drying agent therein was continuously irradiated with light at an intensity of 100 mW/cm², employing a solar simulator (AM1.5G), the short-circuit current density Jsc was determined. As a result, it has proved that the element provides high stability over a long period of time and sufficient light resistance. Further, it has proved that like the organic EL element, the product yield can be improved also in the mass production process of the organic photoelectric conversion element, that is, the production cost can be reduced.

TABLE 1

| Organic EL Element No. | Substrate | Sealing Substrate | Heating Temperature (° C.) | Emission Unevenness | Emission Area | Remarks |
|---|---|---|---|---|---|---|
| 1 | a) | b) | 100 | A | D | Comp. |
| 2 | a) | b) | 120 | A | A | Inv. |
| 3 | a) | b) | 160 | D | B | Comp. |
| 4 | a) | a) | 100 | A | D | Comp. |
| 5 | a) | a) | 120 | A | D | Comp. |
| 6 | a) | a) | 160 | D | B | Comp. |
| 7 | b) | b) | 100 | B | D | Comp. |
| 8 | b) | b) | 120 | D | B | Comp. |
| 9 | b) | b) | 160 | D | C | Comp. |
| 10 | b) | a) | 100 | B | D | Comp. |
| 11 | b) | a) | 120 | D | C | Comp. |
| 12 | b) | a) | 160 | D | C | Comp. |
| 13 | b) | d) | 100 | B | A | Inv. |
| 14 | c) | d) | 100 | B | A | Inv. |
| 15 | a) | c) | 140 | B | A | Inv. |

Comp.: Comparative,
Inv.: Inventive
a) Oriented PEN (with a Tg of 155° C.),
b) Oriented PET (with a Tg of 110° C.),
c) Cast PEN (with a Tg of 120° C.),
d) Cast PET (with a Tg of 80° C.)

As is apparent from Table 1, the inventive organic EL elements provide reduced emission unevenness and high emission efficiency. It is supposed that the reason the comparative organic EL elements are low in emission efficiency is because the sealing performance is deteriorated due to inner stress, resulting in no emission from the end portions, and the emission area is reduced due to increase and growth of dark spots (non-emission points).

Example 2

An organic photoelectric conversion element with a drying agent therein was prepared in the same manner as in organic

| EXPLANATION OF SYMBOLS | |
|---|---|
| 1 | Organic EL Element |
| 2 | Organic EL Structure |
| 3' | Supply Step |
| 301' | Substrate |
| 4' | Hole Transport Layer Formation Step |
| 5' | Light Emission Layer Formation Step |
| 5'a | First Coating Step |
| 5'a1 | Static Nozzle Ejection Device |
| 5'b | First Drying Step |
| 5'c | Second Coating Step |
| 5'c1 | Static Nozzle Ejection Device |

-continued

EXPLANATION OF SYMBOLS

| | |
|---|---|
| 5'd | Second Drying Step |
| 5'e | Third Coating Step |
| 5'e1 | Static Nozzle Ejection Device |
| 5'f | Third Drying Step |
| 7' | Electron injection Layer Formation Step |
| 8' | Second Electrode Formation Step |
| 9' | Protective Layer Formation Step |
| 10 | Recovery Step |
| 11, 12 | Substrate |
| 16 | Sealing Substrate Layer |
| 16A | Adhesive |
| 16B | Sealing Substrate (Sealing Film) |
| 111 | Pedestal of Wiping Device |
| 112 | Wiping Unit |
| 115 | Tape-Shaped Member |
| 116 | Supply Roller |
| 117 | Winding Roller |
| 118 | Solvent Storage Tank |
| 119 | Supply Pipe |
| 121 | Press Roller |
| 122 | Cylinder |
| 140 | Sealing Substrate Layer Formation Step |
| 150 | Cutting Step |
| 151A | Cutting Blade |

The invention claimed is:

1. An organic electronic element manufacturing method comprising the steps of:
forming an organic electronic structure composed of a first electrode, at least one organic layer and a second electrode on a first flexible substrate, and
applying a second flexible substrate for sealing to the resulting organic electronic structure, followed by heating treatment, wherein a heating temperature, at which the heating treatment is carried out, is less than a glass transition temperature Tg of the first flexible substrate and not less than a glass transition temperature Tg of the second flexible substrate for sealing.

2. The organic electronic element manufacturing method of claim 1, wherein a barrier film is formed on the second flexible substrate for sealing.

3. The organic electronic element manufacturing method of claim 1, wherein the first and second flexible substrate are long length substrates.

4. The organic electronic element manufacturing method of claim 1, wherein the organic electronic element is an organic electroluminescent element.

5. An organic electronic element wherein it is manufactured according to the organic electronic element manufacturing method of claim 1.

* * * * *